(12) United States Patent
Kishi et al.

(10) Patent No.: US 8,657,957 B2
(45) Date of Patent: Feb. 25, 2014

(54) METHOD AND APPARATUS FOR MANUFACTURING FUSED SILICA CRUCIBLE, AND THE FUSED SILICA CRUCIBLE

(75) Inventors: Hiroshi Kishi, Akita (JP); Masanori Fukui, Akita (JP); Masaki Morikawa, Akita (JP)

(73) Assignee: Japan Super Quartz Corporation, Akita-Shi (JP)

( * ) Notice: Subject to any disclaimer, the term of this patent is extended or adjusted under 35 U.S.C. 154(b) by 947 days.

(21) Appl. No.: 12/564,197

(22) Filed: Sep. 22, 2009

(65) Prior Publication Data

US 2010/0071613 A1 Mar. 25, 2010

(30) Foreign Application Priority Data

Sep. 24, 2008 (JP) ................ P2008-244521

(51) Int. Cl.
| | |
|---|---|
| *C30B 35/00* | (2006.01) |
| *C30B 11/00* | (2006.01) |
| *C30B 15/00* | (2006.01) |
| *C30B 21/06* | (2006.01) |
| *C30B 27/02* | (2006.01) |
| *C30B 28/10* | (2006.01) |
| *C30B 30/04* | (2006.01) |

(52) U.S. Cl.
USPC .......... 117/208; 117/200; 117/206; 117/217; 117/218

(58) Field of Classification Search
USPC .......... 117/200, 206, 208, 217, 218
See application file for complete search history.

(56) References Cited

U.S. PATENT DOCUMENTS

| | | | | |
|---|---|---|---|---|
| 3,944,640 | A * | 3/1976 | Haggerty et al. | 264/433 |
| 5,082,484 | A | 1/1992 | Koseki et al. | |
| 6,363,098 | B1 * | 3/2002 | Hagihara et al. | 373/88 |
| 6,853,673 | B2 | 2/2005 | Fukui et al. | |
| 7,905,112 | B2 * | 3/2011 | Fukui et al. | 65/17.6 |
| 2003/0210731 | A1 | 11/2003 | Fukui et al. | |
| 2004/0050099 | A1 * | 3/2004 | Fukui et al. | 65/17.6 |
| 2010/0071613 | A1 * | 3/2010 | Kishi et al. | 117/208 |
| 2012/0167818 | A1 * | 7/2012 | Blum et al. | 117/68 |

FOREIGN PATENT DOCUMENTS

| | | |
|---|---|---|
| CN | 1486946 | 4/2004 |
| EP | 1344751 | 9/2003 |
| EP | 2143692 | 1/2010 |
| JP | 11-236233 | 8/1999 |
| JP | 2000-109391 | 4/2000 |

(Continued)

OTHER PUBLICATIONS

Japan Office action, dated Oct. 23, 2012 along with an english translation thereof.

(Continued)

*Primary Examiner* — James McDonough
(74) *Attorney, Agent, or Firm* — Greenblum & Bernstein, P.L.C.

(57) ABSTRACT

A method of manufacturing a fused silica crucible by heating and melting a vitreous silica powder compact shaped into a mold using arc discharge of electrodes arranged around a rotation shaft of the mold, includes the steps of: arranging the electrodes in a ring shape, and setting a ratio W/R of a horizontal distance W between the electrode front end and the surface of the vitreous silica powder compact to a vitreous silica powder compact opening radius R, for at least a predetermined time during arc heating, to be in the range of 0.002 to 0.98.

10 Claims, 8 Drawing Sheets

(56) References Cited

FOREIGN PATENT DOCUMENTS

| | | |
|---|---|---|
| JP | 2001-089171 | 4/2001 |
| JP | 2003-335532 | 11/2003 |
| JP | 3647688 | 2/2005 |
| JP | 2006-169084 | 6/2006 |
| JP | 2008-162839 | 7/2008 |
| JP | 2008-162840 | 7/2008 |

OTHER PUBLICATIONS

Search report from E.P.O., mail date is Jan. 25, 2013.

* cited by examiner

METHOD AND APPARATUS FOR MANUFACTURING FUSED SILICA CRUCIBLE, AND THE FUSED SILICA CRUCIBLE

BACKGROUND OF THE INVENTION

1. Field of the Invention

The present invention relates to a method and an apparatus for manufacturing a fused silica crucible, and the fused silica crucible, and more particularly, a technique using arc melting suitable for manufacturing a large-diameter crucible.

Priority is claimed on Japanese Patent Application No. 2008-244521, filed on Sep. 24, 2008, the content of which is incorporated herein by reference.

2. Description of the Related Art

A method of manufacturing a fused silica crucible by rotational molding is a method of manufacturing a fused silica crucible constituted by a transparent layer on the inside and an opaque layer on the outside by heating and melting a vitreous silica powder accumulated in a rotational mold by arc discharge. An existing configuration of electrodes for forming the arc discharge is disclosed in Japanese Patent No. 3647688 in which three electrodes are used, and an arc (discharge) plasma is formed between the electrodes through a three-phase alternating current.

As the diameters of pulled single crystal increase, there are demands for an increase in size of fused silica crucibles, such as those having a diameter of 32 inches or 40 inches, and an electrode configuration capable of forming an arc discharge with a wide heating range. An existing electrode configuration includes three three-phase electrodes, and when the distance between the electrodes is increased in order to expand the heating range, there is a problem in that the arc becomes unstable and broken. Particularly, in the case of a large crucible, the influence of an air flow on the inside of the crucible increases due to the rotation of the mold, so that the arc is more likely to be broken in the existing electrode configuration.

For this reason, a technique of increasing the number of electrodes is disclosed in JP-A-2003-335532.

SUMMARY OF THE INVENTION

As described above, an attempt to widen the heating range by increasing the number of electrodes has been made, and a configuration of six six-phase AC electrodes is proposed. However, in the configuration of the six six-phase AC electrodes, as illustrated in FIG. 6 of JP-A-2003-335532, an arc discharge between opposed electrodes is more likely to occur than between neighboring electrodes, so that the discharge heat amount of a center portion enclosed by the electrodes increases excessively to a greater extent than the heat amount of peripheral portions, and there is difficulty in uniformly heating the inside of the crucible or the like.

In addition, the internal surface state of the crucible has a direct effect on properties of a pulled semiconductor single crystal, so that very difficult property control is required. However, as described above, since an electrode configuration which enables easy control of the properties of the inner surface of the crucible is not known, although it depends on the experience of the expert, there was a demand for improving the uniformity of crucible quality (properties). Particularly, as the crucible property, there was a demand for maintaining a uniform state, such as a state where surfaces of the wall and the bottom of the crucible have bubble contents of about 0.03% or less. In this method, there is a demand for setting the temperature of any portion in the inner surface of the crucible to be equal to or greater than 1,700° C. and the temperature difference between the portions to be equal to or less than 400° C., and more preferably, equal to or less than 200° C.

The invention is designed to solve the above-mentioned problems. Objects of the invention are:

1. To achieve an improvement in the properties of a manufactured crucible and uniformity thereof,
2. To achieve an improvement in arc stability,
3. To improve control of a heating range, and
4. To be applicable for manufacturing a large-diameter crucible.

According to a first aspect of the invention, there is provided a method of manufacturing a fused silica crucible by heating and melting a vitreous silica powder compact shaped into a mold using arc discharge of electrodes arranged around a rotation shaft of the mold, wherein, when an electrode configuration in which the electrodes are arranged in a ring shape is used, and the vitreous silica powder is heated and melted by not generating a sustainable arc between the electrodes opposed to each other through a center portion of the ring but forming a stable ring-shaped arc that connects the neighboring electrodes, a ratio W/R of a horizontal distance W between the electrode front end and the surface of the vitreous silica powder compact to a vitreous silica powder compact opening radius R, for at least a predetermined time during arc heating, is set to be in the range of 0.002 to 0.98.

According to the invention, the ratio W/R of a horizontal distance W between the electrode front end and the surface of the vitreous silica powder compact to a vitreous silica powder compact opening radius R, for at least a predetermined time during arc heating, is set to be in the range of 0.002 to 0.98. Therefore, the distance between the electrode and the vitreous silica powder compact is defined during the arc discharge, so that an optimal state can be maintained by preventing non-uniformity of the surface temperatures of the vitreous silica powder compact at portions corresponding to the wall of the crucible and the bottom of the crucible. In addition, the melted state can be maintained in a preferable range by preventing a difference between the melted states of the vitreous silica powder of the portions corresponding to the wall of the crucible and the bottom of the crucible. Accordingly, it is possible to manufacture a fused silica crucible having uniform inner surface properties, which may be suitably used for pulling a large-diameter or a large-size single crystal.

In addition, according to the invention, it is possible to set the ratio W/R to be in the range of 0.4 to 0.85.

The invention can be used for crucibles of 26 to 44 to 50 inches. Particularly, in a manufacturing process of a large-diameter crucible of 32 inches or greater, the increased number of electrodes can be used. Therefore, it is possible to improve the output. In addition, as described later, it is possible to increase the electrode opening degree, prevent excessive heating of the portion corresponding to the bottom of the crucible, and prevent non-uniformity of inner surface properties in a direction from the center axis in the inner surface of the crucible, or in the crucible height direction by making the temperature distribution uniform during melting.

In the method of manufacturing a fused silica crucible according to the first aspect of the invention, it is more preferable that a ratio H/R of a vertical distance H between the electrode front end and the surface of the vitreous silica powder compact to the vitreous silica powder compact opening radius R, for at least a predetermined time during arc heating, be set to be in the range of 0.02 to 9.2.

In the method of manufacturing a fused silica crucible of the invention, a ratio H/R of a vertical distance H between the electrode front end and the surface of the vitreous silica powder compact to the vitreous silica powder compact opening radius R, for at least a predetermined time during arc heating, is set to be in the range of 0.02 to 9.2. Therefore, the height of the electrodes from the vitreous silica powder compact during arc discharge is defined, so that the effect of an arc plasma released downward from the electrodes on the portion of the vitreous silica powder compact corresponding to the bottom of the crucible can be controlled, and an optimal state can be maintained by preventing non-uniformity of the surface temperatures of the vitreous silica powder compact at portions corresponding to the wall of the crucible and the bottom of the crucible. In addition, the melted state can be maintained in a preferable range by preventing a difference between the melted states of the vitreous silica powder of the portions corresponding to the wall of the crucible and the bottom of the crucible. Accordingly, it is possible to manufacture a fused silica crucible having uniform inner surface properties, which may be suitably used for pulling a large-diameter or a large-size single crystal.

In addition, according to the invention, it is possible to set the ratio H/R to be in the range of 0.4 to 2.5.

The invention can be used for crucibles of 26 to 44 to 50 inches. Particularly, in a manufacturing process of a large-diameter crucible of 32 inches or greater, it is possible to prevent excessive heating of the portion corresponding to the bottom of the crucible, and prevent non-uniformity of inner surface properties in a direction from the center axis in the inner surface of the crucible, or in the crucible height direction.

In the method of manufacturing a fused silica crucible according to the first aspect of the invention, it is possible to set a ratio $H/H_2$ of the vertical distance H between the electrode front end and the surface of the vitreous silica powder compact to the vitreous silica powder compact height $H_2$, for at least a predetermined time during arc heating, to be in the range of 0.0007 to 4.

In the method of manufacturing a fused silica crucible of the invention, a ratio $H/H_2$ of the vertical distance H between the electrode front end and the surface of the vitreous silica powder compact to the vitreous silica powder compact height $H_2$, for at least a predetermined time during arc heating, is set to be in the range of 0.0007 to 4. Therefore, the height of the electrodes from the vitreous silica powder compact during arc discharge is defined, so that the effect of an arc plasma released downward from the electrodes on the portion of the vitreous silica powder compact corresponding to the bottom of the crucible and the portion corresponding to the wall of the crucible can be controlled, and an optimal state can be maintained by preventing non-uniformity of the surface temperatures of the vitreous silica powder compact at portions corresponding to the wall of the crucible and the bottom of the crucible. In addition, the melted state can be maintained in a preferable range by preventing a difference between the melted states of the vitreous silica powder of the portions corresponding to the wall of the crucible and the bottom of the crucible. Accordingly, it is possible to manufacture a fused silica crucible having uniform inner surface properties, which is suitably used for pulling a large-diameter or a large-size single crystal.

In addition, according to the invention, it is possible to set the ratio $H/H_2$ to be in the range of 0.3 to 2.

The invention can be used for crucibles of 26 to 44 to 50 inches. Particularly, in a manufacturing process of a large-diameter crucible of 32 inches or greater, it is possible to prevent excessive heating of the portion corresponding to the bottom of the crucible, and prevent non-uniformity of inner surface properties in a direction from the center axis in the inner surface of the crucible, or in the crucible height direction.

In the method of manufacturing a fused silica crucible according to the first aspect of the invention, a ratio D/R of the horizontal distance D between the neighboring electrodes to the vitreous silica powder compact opening radius R, for at least a predetermined time during arc heating, may be set to be in the range of 0.04 to 1.1.

In the method of manufacturing a fused silica crucible of the invention, a ratio D/R of the horizontal distance D between the neighboring electrodes to the vitreous silica powder compact opening radius R, for at least a predetermined time during arc heating, is set to be in the range of 0.04 to 1.1. Therefore, since arc discharge is controlled to be in a stable state, an optimal state can be maintained by preventing non-uniformity of the surface temperatures of the vitreous silica powder compact. In addition, the melted state can be maintained in a preferable range by preventing a difference between the melted states of the vitreous silica powder of the portions corresponding to the wall of the crucible and the bottom of the crucible, or a difference between the melted states of the vitreous silica powder in the circumferential direction of the crucible. Accordingly, it is possible to manufacture a fused silica crucible having uniform inner surface properties, which may be suitably used for pulling a large-diameter or a large-size single crystal.

In addition, according to the invention, it is possible to set the ratio D/R to be in the range of 0.2 to 0.7.

In addition, in the method of manufacturing a fused silica crucible described above, a device for forming the ring-shaped arc using an electrode configuration in which the electrodes are arranged in a ring-shape at even intervals such that the absolute value of an alternating current phase difference θ between the neighboring electrodes is in the range of 90°≤θ≤180°, or a device for forming the ring-shaped arc using an electrode configuration in which a ratio of a radius r of a circumference around the mold rotation shaft of the ring to the vitreous silica powder compact opening radius R is in the range of 1 to ¼, for at least a predetermined time during arc heating, may be employed.

Since the method of manufacturing a fused silica crucible of the invention employs an electrode configuration, the ring-shaped arc can be formed while an arc is not substantially formed across the center portion of the ring, and uniform heating can be performed without excessively heating the center portion of the crucible. In addition, in this range of the inter-electrode distances, a suitable heating distance can be maintained with respect to the diameter of the fused silica crucible, and it is good to supply the vitreous silica powder into the mold through the inside of the ring enclosed by the electrodes, so that the wall, the corner, and the bottom of the crucible can be uniformly heated.

According to a second aspect of the invention, there is provided an apparatus for manufacturing a fused silica crucible by rotational molding, including: an electrode configuration in which electrodes are arranged in a ring shape around a rotation shaft of a mold, wherein a sustainable arc is not generated between the electrodes opposed to each other through a center portion of the ring, but a stable ring-shaped arc that connects the neighboring electrodes is formed; and an electrode position setting device capable of setting a ratio W/R of a horizontal distance W between the electrode front end and the surface of the vitreous silica powder compact charged into the mold to a vitreous silica powder compact opening radius R in the range of 0.002 to 0.98.

In the apparatus for manufacturing a fused silica crucible of the invention, the distance between the electrodes and the vitreous silica powder compact during arc discharge is defined by the electrode position setting device, and an optimal state can be maintained by preventing non-uniformity of the surface temperatures of the vitreous silica powder compact at portions corresponding to the wall of the crucible and the bottom of the crucible. In addition, the melted state can be maintained in a preferable range by preventing a difference between the melted states of the vitreous silica powder of the portions corresponding to the wall of the crucible and the bottom of the crucible. Accordingly, it is possible to manufacture a fused silica crucible having uniform inner surface properties, which may be suitably used for pulling a large-diameter or a large-size single crystal.

Particularly, in a manufacturing process of large-diameter crucibles of 32 inches or greater, it is possible to prevent excessive heating of the portion corresponding to the bottom of the crucible, and prevent non-uniformity of inner surface properties in a direction from the center axis in the inner surface of the crucible, or in the crucible height direction.

In the apparatus for manufacturing a fused silica crucible according to the second aspect of the invention, it is preferable that the electrode position setting device set a ratio H/R of a vertical distance H between the electrode front end and the surface of the vitreous silica powder compact to the vitreous silica powder compact opening radius R to be in the range of 0.02 to 9.2.

In the apparatus for manufacturing a fused silica crucible of the invention, the electrode position setting device sets a ratio H/R of a vertical distance H between the electrode front end and the surface of the vitreous silica powder compact to the vitreous silica powder compact opening radius R to be in the range of 0.02 to 9.2. Therefore, the height of the electrode from the vitreous silica powder compact during arc discharge is defined by the electrode position setting device, so that an effect of an arc plasma released downward from the electrodes on the portion of the vitreous silica powder compact corresponding to the bottom of the crucible can be controlled, and an optimal state can be maintained by preventing non-uniformity of the surface temperatures of the vitreous silica powder compact at portions corresponding to the wall of the crucible and the bottom of the crucible. In addition, the melted state can be maintained in a preferable range by preventing a difference between the melted states of the vitreous silica powder of the portions corresponding to the wall of the crucible and the bottom of the crucible. Accordingly, it is possible to manufacture a fused silica crucible having uniform inner surface properties, which may be suitably used for pulling a large-diameter or a large-size single crystal.

Particularly, in a manufacturing process of large-diameter crucibles of 32 inches or greater, it is possible to prevent excessive heating of the portion corresponding to the bottom of the crucible, and prevent non-uniformity of inner surface properties in a direction from the center axis in the inner surface of the crucible, or in the crucible height direction.

In the apparatus for manufacturing a fused silica crucible according to the second aspect of the invention, it is preferable that the electrode position setting device set a ratio H/H2 of the vertical distance H between the electrode front end and the surface of the vitreous silica powder compact to the vitreous silica powder compact height H2 to be in the range of 0.0007 to 4.

In the apparatus for manufacturing a fused silica crucible of the invention, the electrode position setting device sets a ratio H/H2 of the vertical distance H between the electrode front end and the surface of the vitreous silica powder compact to the vitreous silica powder compact height H2 to be in the range of 0.0007 to 4. Therefore, the height of the electrode from the vitreous silica powder compact during arc discharge is defined by the electrode position setting device, so that the effect of an arc plasma released downward from the electrodes on the portion of the vitreous silica powder compact corresponding to the bottom of the crucible and the portion corresponding to the wall of the crucible can be controlled, and an optimal state can be maintained by preventing non-uniformity of the surface temperatures of the vitreous silica powder compact at portions corresponding to the wall of the crucible and the bottom of the crucible. In addition, the melted state can be maintained in a preferable range by preventing a difference between the melted states of the vitreous silica powder of the portions corresponding to the wall of the crucible and the bottom of the crucible. Accordingly, it is possible to manufacture a fused silica crucible having uniform inner surface properties, which may be suitably used for pulling a large-diameter or a large-size single crystal.

Particularly, in a manufacturing process of large-diameter crucibles of 32 inches or greater, it is possible to prevent excessive heating of the portion corresponding to the bottom of the crucible, and prevent non-uniformity of inner surface properties in a direction from the center axis in the inner surface of the crucible, or in the crucible height direction.

In the apparatus for manufacturing a fused silica crucible according to the second aspect of the invention, the electrode position setting device sets a ratio D/R of the horizontal distance D between the neighboring electrodes to the vitreous silica powder compact opening radius R to be in the range of 0.04 to 1.1.

In the apparatus for manufacturing a fused silica crucible of the invention, the electrode position setting device sets a ratio D/R of the horizontal distance D between the neighboring electrodes to the vitreous silica powder compact opening radius R to be in the range of 0.04 to 1.1. Therefore, the electrode position setting device controls arc discharge to be in a stable state and an optimal state can be maintained by preventing non-uniformity of the surface temperatures of the vitreous silica powder compact. In addition, the melted state can be maintained in a preferable range by preventing a difference between the melted states of the vitreous silica powder of the portions corresponding to the wall of the crucible and the bottom of the crucible, or a difference between the melted states of the vitreous silica powder in the circumferential direction of the crucible. Accordingly, it is possible to manufacture a fused silica crucible having uniform inner surface properties, which may be suitably used for pulling a large-diameter or a large-size single crystal.

Particularly, in a manufacturing process of large-diameter crucibles of 32 inches or greater, it is possible to prevent excessive heating of the portion corresponding to the bottom of the crucible, and prevent non-uniformity of inner surface properties in a direction from the center axis in the inner surface of the crucible, or in the crucible height direction.

In the apparatus for manufacturing a fused silica crucible described above according to the invention, a device provided with an electrode configuration in which the electrodes are arranged in a ring-shape such that the absolute value of an alternating current phase difference $\theta$ between the neighboring electrodes is in the range of $90° \leq \theta \leq 180°$ may be included, or the electrode position setting device may employ a device for setting a ratio of a radius r of a circumference around the mold rotation shaft of the ring to the vitreous silica powder compact opening radius R to be in the range of 1 to ¼.

In the apparatus for manufacturing a fused silica crucible of the invention, a device provided with an electrode configuration in which the electrodes are arranged in a ring-shape such that the absolute value of an alternating current phase difference θ between the neighboring electrodes is in the range of 90°≤θ≤180° may be included, or the electrode position setting device may employ a device for setting a ratio of the radius r of the circumference around the mold rotation shaft of the ring to the vitreous silica powder compact opening radius R to be in the range of 1 to ¼. According to the manufacturing apparatus of the invention having the above-mentioned configuration, the center portion enclosed by the electrodes is not excessively heated, and the crucible inner surface can be uniformly heated. In addition, it is only necessary to increase the distance between the neighboring electrodes in the range that enables arc discharge, so that a large-diameter crucible can be uniformly heated.

The apparatus for manufacturing a fused silica crucible described above may include one of the following electrode configurations: four two-phase AC electrodes, six two-phase AC electrodes, eight two-phase AC electrodes, ten two-phase AC electrodes, three three-phase AC electrodes, six three-phase AC electrodes, nine three-phase AC electrodes, twelve three-phase AC electrodes, fifteen three-phase AC electrodes, four four-phase AC electrodes, eight four-phase AC electrodes, twelve four-phase AC electrodes, and sixteen four-phase AC electrodes.

The apparatus for manufacturing a fused silica crucible of the invention, may include one of the following electrode configurations: four two-phase AC electrodes, six two-phase AC electrodes, eight two-phase AC electrodes, ten two-phase AC electrodes, three three-phase AC electrodes, six three-phase AC electrodes, nine three-phase AC electrodes, twelve three-phase AC electrodes, fifteen three-phase AC electrodes, four four-phase AC electrodes, eight four-phase AC electrodes, twelve four-phase AC electrodes, and sixteen four-phase AC electrodes. Accordingly, it is possible to set the distance between the electrodes and the vitreous silica powder compact or the inter-electrode distance to be in the above-mentioned ranges.

According to another aspect of the invention, there is provided a fused silica crucible manufactured by the method described above or the apparatus described above, wherein the bobble content of a transparent layer of the bottom and a transparent layer of the wall is equal to or less than 0.03%.

According to the invention, it is possible to manufacture a fused silica crucible in which the bubble content of the transparent layer of the bottom and the transparent layer of the wall is equal to or less than 0.03%.

At least a predetermined time during arc heating may be a time for which a stable arc can be maintained after a predetermined time from power supply is started. Specifically, a time of 5 to 80 to 95% of the total heating time, excluding the time to make the arc stable, may be controlled as described above.

According to the invention, the crucible properties mean factors that have effects on the properties of a semiconductor single-crystal pulled from the fused silica crucible, such as the vitrification state on the inner surface of the crucible, the bubble distribution and bubble size in a thickness direction, the OH group content, impurity distributions, unevenness of the surface, and non-uniform distribution states in a crucible height direction.

Here, the horizontal distance W between the electrode front end and the surface of the vitreous silica powder compact device the shortest distance between the position of the electrode axial line at the electrode front end portion having the bar shape and the surface of the vitreous silica powder compact, and in the case where the plural electrodes are arranged in a ring shape to be concentric with the mold along the mold rotation shaft, the horizontal distances W from the electrodes are the same. However, in the case where the center of the ring is deviated in the horizontal direction, or in the case where the distances between the electrodes and the surface of the vitreous silica powder compact are different from each other, the shortest one of the distances from the electrodes to the surface of the vitreous silica powder compact is referred to as the horizontal distance W.

In addition, the electrode front end portion is oxidized and consumed by maintaining the arc discharge. However, according to the invention, even for the consumed electrodes, controlling the distance between the position of the electrode axial line at the electrode front end portion and the surface of the vitreous silica powder compact is included.

In addition, the vitreous silica powder compact opening radius R device a radius of the opening of the inner surface of the vitreous silica powder compact and is almost the same as the half the opening diameter of the manufactured fused silica crucible.

Particularly, as the crucible properties for achieving uniformity of the surfaces of the wall and the bottom of the fused silica crucible, there was a demand for a suitable bubble content. This device a demand for controlling the bubble content to be equal to or less than 0.03% at any point on the inner surface of the crucible.

In the case where the electrode opening degree is small, as in the related art, the relationship between the wall temperature and the bottom temperature during the manufacturing process of the crucible was: the bottom temperature>the wall temperature. Therefore, the bubble content of the wall is increased, and this deteriorated the uniformity of the bubble content.

The temperature of the vitreous silica powder compact or the glass upon melting (fused silica crucible) is determined by high-temperature gas G (full line) and radiation R (dashed line) generated by arc discharge, as illustrated in FIG. 15. The temperatures of the high-temperature gas at points P1 to P5 illustrated in the figure are in the order of P5>P4>P3>P2>P1, and amounts of heat given by the radiation at the points P1 to P5 illustrated in the figure are in the order of P1>P2>P3>P4>P5. As described above, the sum of the two amounts of heat of the high-temperature gas G and the radiation R determines the temperature of the crucible (object to be melted), so that it is ideal that the sum (high-temperature gas G+radiation R) of the heat amounts is uniform.

As illustrated in FIG. 15, when the electrode opening degree be small, the sum of the heat amounts of the high-temperature gas G and the radiation R becomes non-uniform, the distance W between the electrode and the glass is great, and the radiation heat is reduced. Therefore, the temperature of the bottom of the crucible is higher than the wall. In this case, unwanted effects, such as the following two crucible property deteriorations occur as follows:

1. In the case where the wall is heated to reduce bubbles, the bottom temperature reaches an excessively high temperature, and the glass of the bottom is moved to the corner by centrifugal force with the rotation of the mold 10, so that there is a high possibility that deformation will occur.

2. When the upper limit of the bottom temperature is determined in order to suppress a reduction in 1 described above, the bubble content of the wall increases, and the uniformity of the bubble contents is degraded.

Here, the electrode opening degree device the radius of a circle formed by electrodes in a plan view determined by the maximum value of the inter-electrode distance D necessary to prevent arc breakage, that is, to maintain the stability of the arc generation.

On the contrary, according to the invention, as illustrated in FIG. 16, the electrode opening degree can be increased. In this case, the inter-electrode distance can be increased without arc breakage, so that the wall temperature during the manufacturing process of the crucible can be increased to be higher than that in the existing case. Accordingly, the wall temperature and the bottom temperature during the manufacturing process of the crucible can be almost equal to each other as follows:

bottom temperature wall temperature (the temperature difference is within 400° C., and preferably, within 200° C.).

Accordingly, the bubble content can be equal to or less than 0.03% at any point on the inner surface of the crucible, so that the uniform bubble content can be realized, and uniformity of the bubble content can be enhanced. Therefore, it is possible to prevent deterioration of the crucible properties.

In addition, as described above, it is possible to make the quality of the inner surface of the same crucible uniform, and it is possible to make the quality of a plurality of the crucibles uniform.

This is because it is possible to reduce an imbalance between power amounts according to the invention. An imbalance between power amounts is caused by the Lorentz force exerted on each electrode to oscillate the electrodes. According to the invention, the electrode opening degree is increased as compared with the existing case, in other words, the effect of the Lorentz force is reduced, so that electrode oscillation is reduced. Therefore, the imbalance between the amounts of power used is reduced in the crucible. The power amount device the total amount of power used by the total electrodes of the total phases to terminate an arc.

Here, the vertical distance H between the electrode front end and the surface of the vitreous silica powder compact device the shortest distance between the position of the electrode axial line at the electrode front end portion having the bar shape and the surface of the vitreous silica powder compact. In the case where the plural electrodes are arranged in a ring shape to be concentric with the mold around the mold rotation shaft, the vertical distances H from the electrodes are the same. However, in the case where the center of the ring is deviated in the horizontal direction, or in the case where the distances between the electrodes and the surface of the vitreous silica powder compact are different from each other, the shortest one of the distances from the electrodes to the surface of the vitreous silica powder compact is referred to as the vertical distance H.

Here, the vitreous silica powder compact height H2 device the height of the vitreous silica powder compact from the bottom of the mold to the upper end portion.

Here, the horizontal distance D between the neighboring electrodes device the distance between the positions of the electrode axial lines at the electrode front end portions having the bar shape.

In addition, in the method of manufacturing a fused silica crucible by heating and melting a vitreous silica powder in the mold using arc discharge of the electrodes arranged around the rotation shaft of the mold, the electrode configuration in which the electrodes are arranged in a ring shape at even intervals is used, a sustainable arc is not generated between the electrodes opposed to each other through the center portion of the ring, and a stable ring-shaped arc that connects the neighboring electrodes is formed, thereby heating and melting the vitreous silica powder.

In the manufacturing method of the invention, an arc is formed between the electrodes next to each other, however, a sustainable arc is not formed between the electrodes opposed to each other through the center portion of the ring. Therefore, the center portion of the ring enclosed by the electrodes is not excessively heated, and the inside of the crucible can be uniformly heated. In addition, in order to widen the heating range, it is only necessary to increase the inter-electrode distance in the range that enables arc discharge, so that the heating range can be easily widened. Therefore, a large-diameter crucible can be uniformly heated.

In addition, the manufacturing method according to the invention includes a manufacturing method of heating and melting vitreous silica powder through a range enclosed by a ring-shaped arc. According to the manufacturing method, the vitreous silica powder layer accumulated in the rotational mold in advance is heated and melted by the ring-shaped arc while performing pressure-reduction, thereby forming the inner peripheral layer of the crucible into a transparent glass layer. In addition, while the vitreous silica powder accumulated in the rotational mold in advance is heated and melted by the ring-shaped arc plasma, the vitreous silica powder is allowed to fall off through the inside of the ring-shaped arc plasma so as to be heated and melted, and the melted fused silica is accumulated on the inner surface of the fused silica crucible, thereby forming a fused silica crucible having the transparent layer (thermal spraying). The manufacturing method of the invention includes either method.

In addition, the invention relates to the apparatus for manufacturing a fused silica crucible by rotational molding, and the apparatus for manufacturing a fused silica crucible, which has the electrode configuration in which electrodes are arranged in a ring shape around the rotation shaft of a mold at even intervals, does not generate a sustainable arc between the electrodes opposed to each other through the center portion of the ring, and forms a stable ring-shaped arc that connects the neighboring electrodes.

In addition, the invention relates to a fused silica crucible in which the bubble content of the bottom transparent layer within 1 mm from the inner surface of the crucible is equal to or less than 0.03%, and the bubble content of the wall transparent layer is equal to or less than three times the bubble content of the bottom transparent layer. According to the manufacturing method and the manufacturing apparatus, since the inner surface of the crucible is uniformly heated, it is possible to manufacture a fused silica crucible for pulling a single-crystal silicon in which the bubble content of the bottom transparent layer is equal to or less than 0.03%, and the bubble content of the wall transparent layer is equal to or less than three times the bubble content of the bottom transparent layer.

According to the invention, by defining the electrode position, a stable ring-shaped arc is formed along the inner peripheral surface of the mold to heat and melt the vitreous silica powder on the inner peripheral surface of the mold. In addition, an arc crossing the center portion of the ring is not substantially formed. Therefore, excessive heating of the bottom of the crucible is prevented, and the crucible can be uniformly heated from the wall to the bottom. Accordingly, a fused silica crucible having a good transparent glass layer can be manufactured. In addition, there are advantages in that the arc is stable, the heating range is wide, so that a fused silica crucible as a large crucible with good quality can be obtained.

DETAILED DESCRIPTION OF THE INVENTION

Hereinafter, a method and an apparatus for manufacturing a fused silica crucible, and the fused silica crucible according to an embodiment of the invention will be described with reference to the accompanying drawings.

Figure 1:
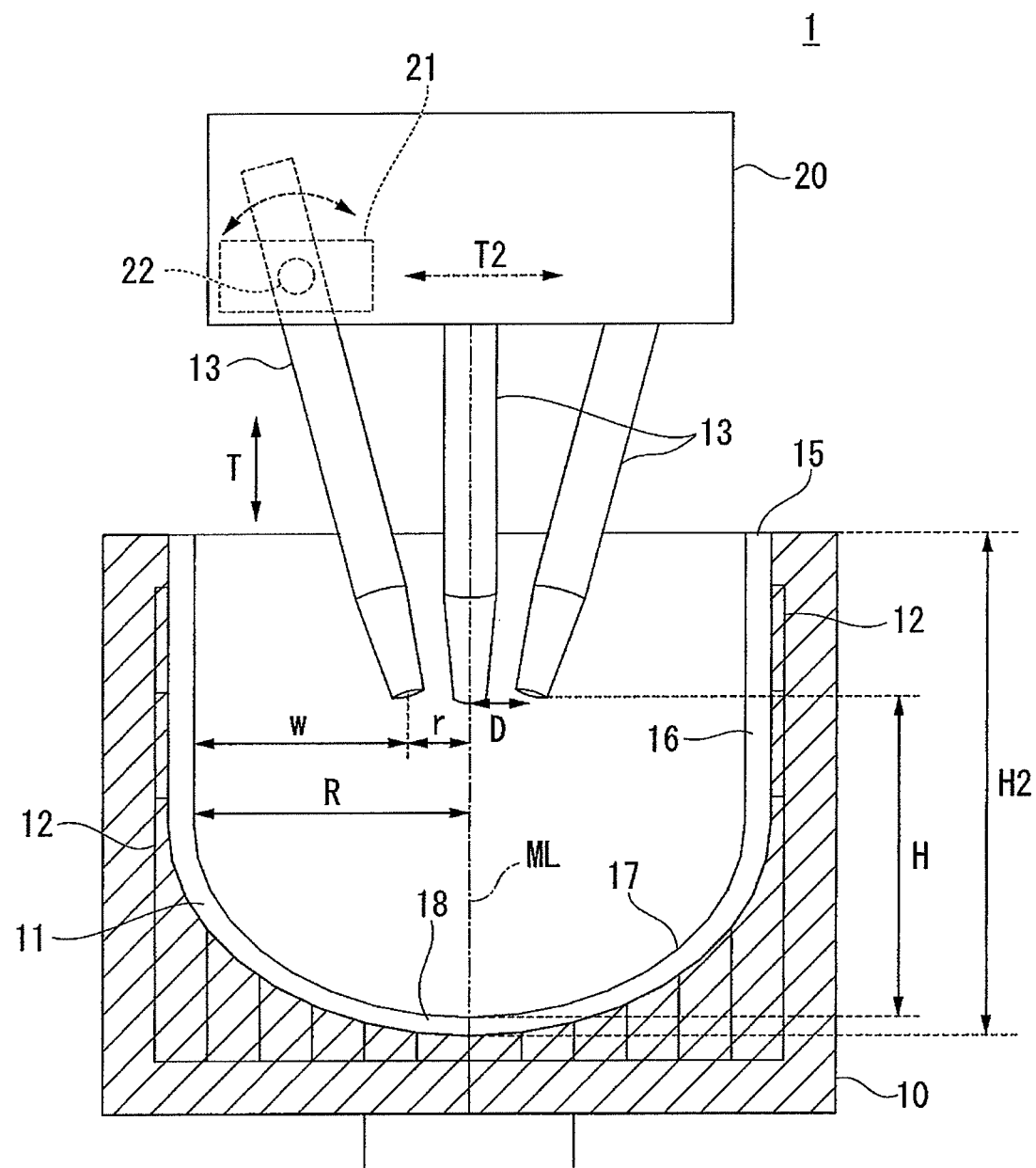
FIG. 1 is a front view schematically illustrating an apparatus for manufacturing a fused silica crucible according to an embodiment of the invention.

FIG. 1 is a front view schematically illustrating an apparatus for manufacturing a fused silica crucible according to an embodiment of the invention. In FIG. 1, reference numeral 1 denotes the apparatus for manufacturing a fused silica crucible.

In the description, the apparatus 1 for manufacturing a fused silica crucible according to this embodiment is used for manufacturing a fused silica crucible of 32 inches or greater. However, as long as it is an apparatus for manufacturing a fused silica crucible using arc melting, it is not limited by the crucible diameter or the purpose as an apparatus output, and is not limited to this configuration.

In this embodiment, the apparatus 1 for manufacturing a fused silica crucible includes, as illustrated in FIG. 1, a mold 10 which can be rotated by a rotating device not shown about a rotation shaft ML and defines the outer appearance of a fused silica crucible. A raw powder (vitreous silica powder) is charged into the mold 10 by a predetermined thickness to become a vitreous silica powder compact 11. Inside the mold 10, a number of air passages 12 which are open to the inner surface and connected to a pressure-reducing device not shown are provided to reduce the pressure in the vitreous silica powder compact 11. At an upper position of the mold 10, carbon electrodes 13, 13, and 13 for arc heating, which are connected to a power supply device not shown, are provided to heat and melt the vitreous silica powder compact 11 thereby manufacturing a fused silica crucible.

The carbon electrodes 13, 13, and 13 have an electrode configuration in which they are arranged in a ring shape at even intervals around the rotation shaft ML of the mold 10. In the configuration, a sustainable arc is not generated between electrodes opposed to each other through a center portion of the ring, but a stable ring-shaped arc that connects the neighboring electrodes can be formed. The carbon electrodes 13, 13, and 13 can be allowed to move vertically, and an inter-electrode distance D can be set by an electrode position setting device 20, as shown by arrows T and D in the figure. In addition, horizontal distances W of the carbon electrodes 13, 13, and 13 from the surface of the vitreous silica powder compact 11 can be set by the electrode position setting device 20.

Figure 2A:
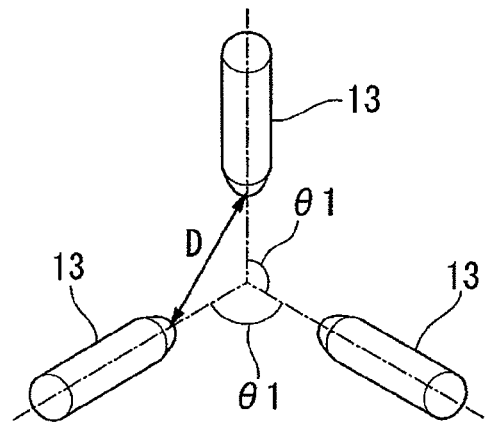
FIGS. 2A and 2B are a plan view and a front view schematically illustrating carbon electrode positions in the apparatus for manufacturing a fused silica crucible according to the embodiment of the invention.
Figure 2B:
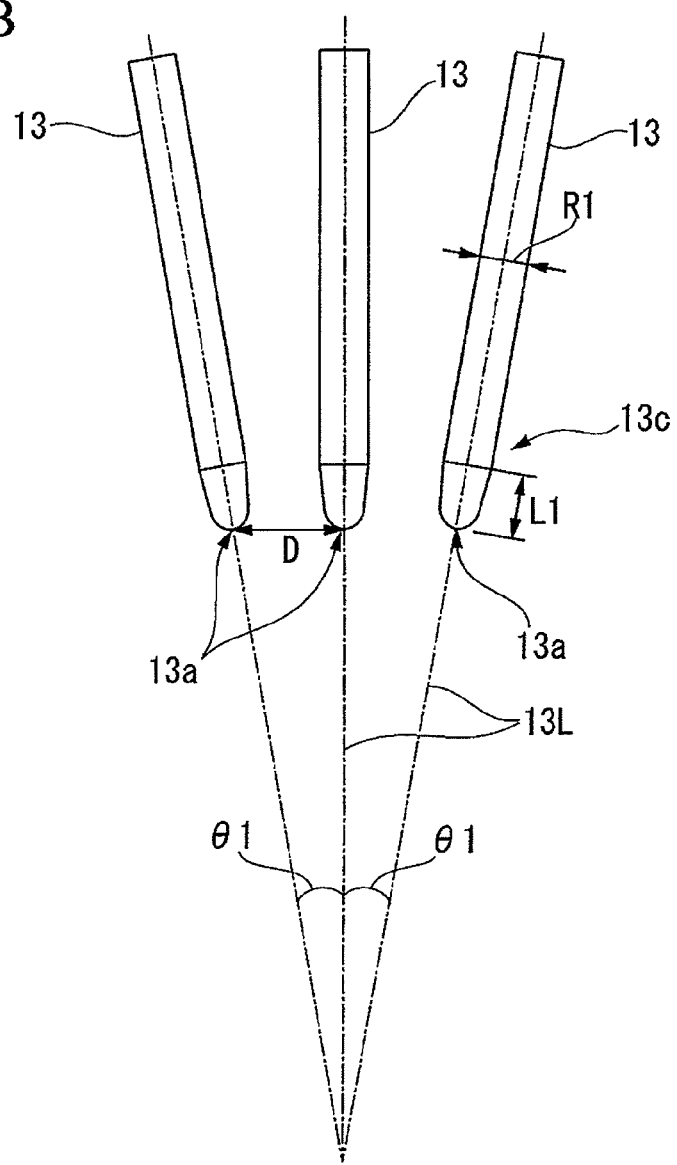

FIGS. 2A and 2B are a plan view and a front view schematically illustrating carbon electrode positions in the apparatus for manufacturing a fused silica crucible according to the embodiment of the invention.

The carbon electrodes 13, 13, 13 are electrode bars having the same shape so as to perform, for example, AC three-phase (R-phase, S-phase, and T-phase) arc discharge, and as illustrated in FIGS. 1 and 2, the axial lines 13L are provided to form a reverse triangular pyramidal shape with an apex therebelow at an angle θ1. The inter-electrode distances D can be changed while maintaining this angle.

The electrode position setting device 20 includes, as shown by arrows T and T2 in FIG. 1, supporting units 21 for supporting the carbon electrodes 13, 13, and 13 and capable of setting inter-electrode distances D, a horizontal movement device for allowing the supporting unit 21 to move horizontally, and a vertical movement device for allowing the supporting units 21 and the horizontal movement device thereof to move vertically in one body. In the supporting unit 21, the carbon electrode 13 is supported to rotate about an angle setting shaft 22, and a rotation device for controlling the rotation angle of the angle setting shaft 22 is included. In order to control the inter-electrode distance D between the carbon electrodes 13 and 13, the angle of the carbon electrode 13 is controlled by the rotation device, and the horizontal position of the supporting unit 21 is controlled by the horizontal movement device. In addition, the height of the supporting unit 21 is controlled by the vertical movement device thereby controlling the height of an electrode front end portion 13a with respect to the bottom position of the vitreous silica powder compact 11.

In addition, in the figure, the supporting unit 21 and the like for the carbon electrode 13 only on the left are illustrated, however, other electrodes are supported by the same configuration, and the heights of the carbon electrodes 13 can be individually controlled.

The electrode position setting device 20, as illustrated in FIG. 1, sets a ratio W/R of the horizontal distance W between the electrode front end 13a and the surface of the vitreous silica powder compact 11 filled in the mold 10 to the vitreous silica powder compact opening radius R, for at least a predetermined time during arc heating, to be in the range of 0.002 to 0.98, or in the range of 0.4 to 0.85.

The electrode position setting device 20, as illustrated in FIG. 1, sets a ratio H/R of a vertical distance H between the electrode front end 13a and the surface of the vitreous silica powder compact 11 to the vitreous silica powder compact opening radius R, for at least a predetermined time during arc heating, to be in the range of 0.02 to 9.2, or in the range of 0.4 to 2.5.

The electrode position setting device 20, as illustrated in FIG. 1, sets a ratio H/H2 of the vertical distance H between the electrode front end 13a and the surface of the vitreous silica powder compact 11 to the vitreous silica powder compact height 112, for at least a predetermined time during arc heating, to be in the range of 0.0007 to 4, or in the range of 0.3 to 2.

The electrode position setting device 20, as illustrated in FIG. 1, sets a ratio D/R of the horizontal distance D between the neighboring electrodes 13 and 13 to the vitreous silica powder compact opening radius R, for at least a predetermined time during arc heating, to be in the range of 0.04 to 1.1, or in the range of 0.2 to 0.7.

Here, with regard to the dimensions, as illustrated in FIGS. 1 and 2, the horizontal distance W device the shortest distance between the position of the electrode axial line 13L at the electrode front end portion 13a having the bar shape and the surface of the vitreous silica powder compact 11, and the vitreous silica powder compact opening radius R device the radius of the opening of the inner surface of the vitreous silica powder compact 11 and is almost the same as half the diameter of the manufactured fused silica crucible.

In addition, the vertical distance H device the shortest distance between the position of the electrode axial line 13L at the electrode front end portion 13a having the bar shape and the surface of the vitreous silica powder compact 11, and the vitreous silica powder compact height H2 device the height of the upper end portion of a rim 15 of the formed vitreous silica powder compact 11 from the lowest portion of the bottom portion of the mold 10.

In addition, the horizontal distance D between the neighboring electrodes 13 and 13, as illustrated in FIGS. 1 and 2, device a distance between the positions of the electrode axial lines 13L at the electrode front end portion 13a having the bar shape.

The apparatus 1 for manufacturing a fused silica crucible is a high-output apparatus for heating and melting a non-conductive object (vitreous silica powder) by arc discharge using the plural carbon electrodes 13, 13, and 13 in an output range of 300 to 12,000 kVA.

In this embodiment, the vitreous silica powder is used as the raw powder. However, the "vitreous silica powder" described herein is not limited to vitreous silica, and may also include a powder made of a material well known as a raw material of the fused silica crucible, such as crystal and silica sand containing silicon dioxide (silica).

The carbon electrode 13 is set such that a ratio LL/R1 of a length LL consumed per unit time (minute) during arc discharge to a diameter R1 of the uniform-diameter portion is in the range of 0.02 to 0.6.

In this case, the diameter R1 of the carbon electrode 13 is determined from the output of the arc discharge, the amount of the raw powder to be melted and the melting temperature which are defined by the diameter (size) of the fused silica crucible, the time needed to maintain arc discharge, and required electrode strength.

Specifically, in a manufacturing process of a fused silica crucible of 32 inches, the length LL consumed per unit time during arc discharge is about 200 mm for 20 minutes, that is, about 10 mm per minute, and the diameter R1 of the carbon electrode 13 in this case is 20 to 30 to 100 to 120 mm.

The apparatus 1 for manufacturing a fused silica crucible employs the electrode configuration in which the electrodes are arranged in a ring shape at even intervals around the rotation shaft of the mold so as not to excessively heat the bottom portion of the vitreous silica crucible but to uniformly heat and melt the vitreous silica powder in the mold. So as not to generate a sustainable arc between the electrodes opposed to each other through a center portion of the ring but form a stable ring-shaped arc that connect the neighboring electrodes, for example, an electrode configuration is used in which an alternating current phase difference θ (absolute value) between the neighboring electrodes is 90°≤θ≤180°.

In addition, in the following description, the phase difference θ between the neighboring electrodes is an absolute value. As the electrode configuration, for example, there are electrode configurations of four two-phase AC electrodes, six two-phase AC electrodes, eight two-phase AC electrodes, ten two-phase AC electrodes, three three-phase AC electrodes, six three-phase AC electrodes, nine three-phase AC electrodes, twelve three-phase AC electrodes, fifteen three-phase AC electrodes, four four-phase AC electrodes, eight four-phase AC electrodes, twelve four-phase AC electrodes, or sixteen four-phase AC electrodes. In the case where the electrodes are connected via direct current, an even number of electrodes may be provided in a ring shape so that the neighboring electrodes have different phases.

Figure 3:
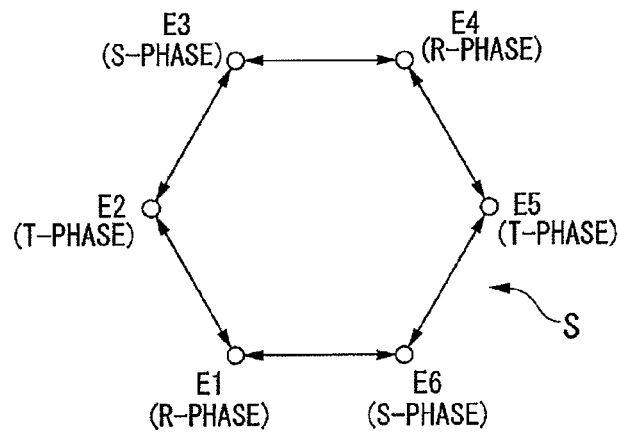
FIG. 3 is a diagram schematically illustrating carbon electrode positions in the apparatus for manufacturing a fused silica crucible according to the embodiment of the invention.

FIG. 3 is a diagram schematically illustrating horizontal positions at the electrode front end height as an example of the embodiment.

As an example of the electrode configuration (electrode position relationship) of this embodiment, in FIG. 3, six three-phase AC electrodes are shown.

In this example, the six electrodes (E1 to E6) are used for three-phase alternating current. In this electrode configuration, the electrodes are arranged around the rotation shaft of the mold at even intervals, and a hexagonal ring connecting the electrodes is formed. The neighboring electrodes for the three-phase alternating current have a phase difference of 120°, and the electrodes opposed to each other through the center portion of the ring have the same phase. Specifically, the electrodes are connected such that when the electrode E1 has the R phase for the three-phase alternating current, the electrode E4 opposed thereto through the center portion of the ring has the same R phase, the electrodes E2 and E6 on the both sides of the electrode E1 have the T-phase and the S-phase, respectively, and the electrodes E3 and E5 on the outer side thereof have the S-phase and the T-phase, respectively. Therefore, the electrodes E1 and E4, the electrodes E2 and E5, and the electrodes E3 and E6 each have the same phase, and the electrodes coupled differently from the case have the different phases.

In the illustrated electrode configuration, the electrode E1 has a different phase from those of the electrodes E2 and E6 on both sides, a stable arc is formed between the electrode E1 and the electrodes E2 and E6 on both sides, so that a ring-shaped arc that connects the neighboring electrodes along the inner surface of the crucible is formed. On the other hand, when the electrodes E1 and E4 which are opposed to each other through the center portion of the ring have the same phase, an arc is not formed across the center portion of the ring, and excessive heating of the center portion of the crucible can be avoided. In addition, even when the distance between the neighboring electrodes in the electrode configuration is increased in order to widen the heating range, the arc is formed along the neighboring electrodes that are closest to each other. Therefore, the arc is hardly broken, and a stable arc can be maintained. In addition, according to the invention, the ring-shaped arc along the inner surface of the crucible is not limited to an arc which is formed by electrodes that protrude into the inside of the crucible, and may include an arc which is formed by the electrodes disposed above the opening of the crucible to be concentric with the inner peripheral surface of the crucible.

Figure 4:
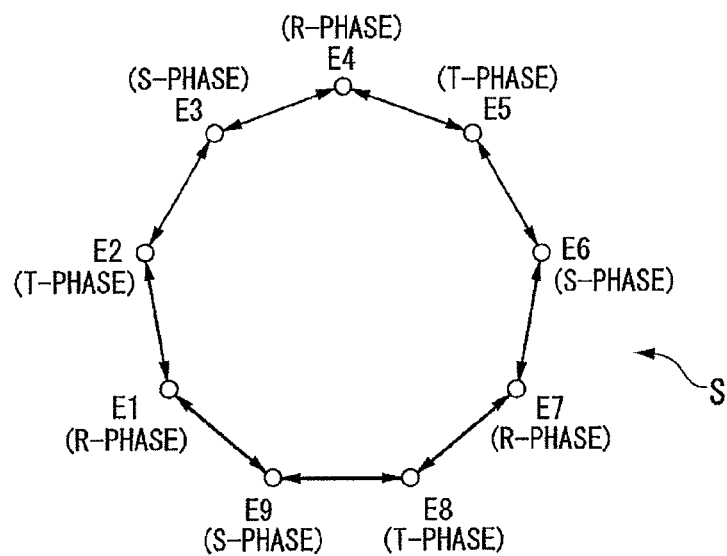
FIG. 4 is a diagram schematically illustrating carbon electrode positions in the apparatus for manufacturing a fused silica crucible according to the embodiment of the invention.

FIG. 4 is a diagram schematically illustrating horizontal positions at the electrode front end height as another example of the embodiment.

An example using nine electrodes (E1 to E9) for the three-phase alternating current is illustrated in FIG. 4. In this electrode configuration, the electrodes are arranged around the rotation shaft of the mold at even intervals, and a nonagonal ring connecting the neighboring electrodes is formed. The neighboring electrodes for the three-phase alternating current have a phase difference of 120°. Specifically, as illustrated in the figure, when the electrode E1 has the R-phase, the electrodes E2 and E9 on the both sides have the T-phase and the S-phase, respectively, the electrodes E3 and E5 on the both sides of the electrode E4 have the S-phase and the T-phase, respectively, and the electrodes E6 and E8 on both sides of the electrode E7 have the S-phase and the T-phase, respectively. Here, since the electrodes E2 and E9 next to the electrode E1 have phase differences from that of the electrode E1, a stable arc is formed between these and the electrode E1. However, the electrode E4 and the electrode E7 opposed thereto through the center portion of the ring have the same phase as that of the electrode E1, an arc is not formed between these electrodes. In addition, the two electrodes E3 and E8 next to the electrode E1, and the electrodes E5 and E6 opposed to the electrode E1 over the center portion of the ring all have phase differences from the electrode E1. However, the inter-electrode distances between these and the electrode E1 are greater than those between the electrodes E2 and E9 and the electrode E1. Therefore, even when an arc is temporarily generated between those and the electrode E1, the arc does not continue, and a stable arc is not formed. Therefore, an arc crossing the center portion enclosed by the electrodes is not substantially formed, and the ring-shaped arc that connects the neighboring electrodes is formed. In general, in an electrode configuration of 3 n three-phase AC electrodes (n≥4), in the same manner as the above-mentioned configuration, a ring-shaped arc that connects the neighboring electrodes is formed, and a stable arc crossing the center portion of the ring is not substantially formed.

Figure 5:
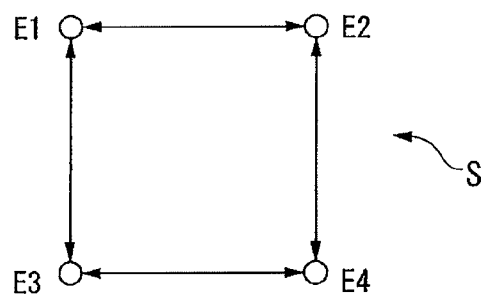
FIG. 5 is a diagram schematically illustrating carbon electrode positions in the apparatus for manufacturing a fused silica crucible according to the embodiment of the invention.

FIG. 5 is a diagram schematically illustrating horizontal positions at the electrode front end height as another example of the embodiment.

An electrode configuration using four electrodes (E1 to E4) for the two-phase alternating current is illustrated in FIG. 5. In this electrode configuration, the electrodes are arranged around the rotation shaft of the mold at even intervals, and a square ring connecting the electrodes is formed. Since the neighboring electrodes for the two-phase alternating current have a phase difference of 180°, an arc is generated between the neighboring electrodes. However, since the electrodes that face each other through the ring center portion have the same phase, an arc is not generated between the electrodes, and an arc crossing the ring center portion is not formed. In general, in an electrode configuration of 2 n two-phase AC electrodes (n≥3), in the same manner as the above-mentioned configuration, a ring-shaped arc that connects the neighboring electrodes is formed, and a stable arc crossing the center portion of the ring is not substantially formed.

Figure 6:
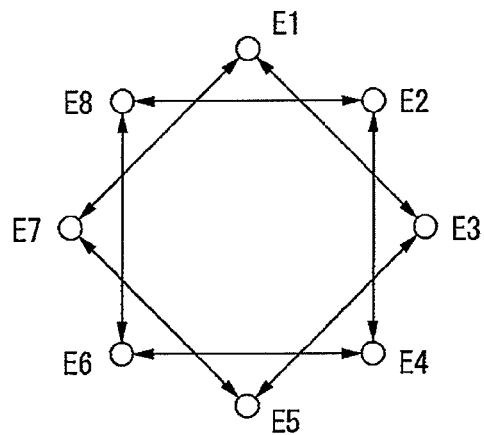
FIG. 6 is a diagram schematically illustrating carbon electrode positions in the apparatus for manufacturing a fused silica crucible according to the embodiment of the invention.

FIG. 6 is a diagram schematically illustrating horizontal positions at the electrode front end height as another example of the embodiment.

An electrode configuration using eight electrodes (E1 to E8) for the four-phase alternating current is shown in FIG. 6. In the electrode configuration, the electrodes are arranged around the rotation shaft of the mold at even intervals and an octagonal ring connecting the electrodes is formed. The neighboring electrodes for the four-phase alternating current have a phase difference of 90°, and the electrodes that are next but one to each other have a phase difference of 180°. Since an arc is generally generated between electrodes having a high phase difference, in this electrode configuration, an arc is generated between the electrodes that are next but one to each other, and a ring-shaped arc that connects the electrodes that are next but one to each other is formed. According to the invention, the ring-shaped arc connecting the neighboring electrodes includes an arc connecting electrodes that are next but one to each other. On the other hand, the electrodes opposite to each other through the center portion of the ring have the same phase, so that an arc is not formed between these electrodes. In addition, even if an arc is temporarily generated between the electrodes having phase differences through the center portion of the ring, since the inter-electrode distance is large, the arc does not continue, and a stable arc is not substantially formed.

Figure 7:
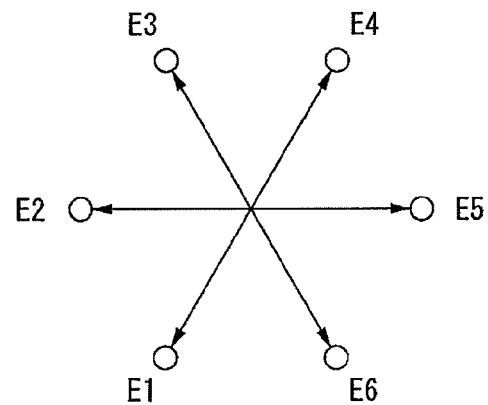
FIG. 7 is a diagram schematically illustrating carbon electrode positions in the apparatus for manufacturing a fused silica crucible according to the embodiment of the invention.

Further, in an existing electrode configuration of six six-phase AC electrodes illustrated in FIG. 7, from the electrode E1, the current phases of the electrodes E2 to E6 are sequentially displaced by 60°, and the phase difference between the electrode E1 and the electrode E4 opposed thereto is greatest (180°). Since an arc is more likely to be generated between electrodes having the greatest current phase difference, in this electrode configuration, arcs are generated between the electrodes E1 and E4 at opposed positions to each other (diagonal positions), the electrodes E2 and E5, and the electrodes E3 and E6, and the arcs intersect at the center portion enclosed by the electrodes E2 to E6. In addition, in this electrode configuration, when the distance between the neighboring electrodes is increased, the inter-electrode distance between the diagonal positions is significantly increases, so that the arc becomes unstable and is more likely to be broken. On the contrary, in the electrode configuration according to the invention, since the ring-shaped arc connecting the neighboring electrodes is formed, the arc is less likely to be broken even when the inter-electrode distance is increased, so that a stable arc can be maintained.

Next, as illustrated in FIG. 3, with regard to the size of the ring foamed by connecting the electrodes E1 to E6, when the circumference around the rotation axis is assumed to be S, it is preferable that, with respect to the radius R of the opening of the crucible, the radius r of the circumference S penetrate by a size of 1 to ¼ for at least a predetermined time during arc heating. In this size range, the heating of the corner and the bottom from the wall of the crucible becomes almost uniform. In addition, in a thermal spraying process, it is good to supply the vitreous silica powder into the mold through the inside enclosed by the electrodes. On the other hand, when the radius r of the circumference S formed by the electrodes is greater than the radius R of the opening, the electrodes cannot be inserted into the crucible, so that the heating of the bottom of the crucible becomes insufficient. In addition, when the radius r of the circumference is smaller than ¼ of the radius R of the opening, the heating of the wall of the crucible becomes insufficient. In addition, when the vitreous silica powder is supplied through the range of the inside enclosed by the electrodes, since the range is narrow, it is difficult to supply the vitreous silica powder.

Figure 8:
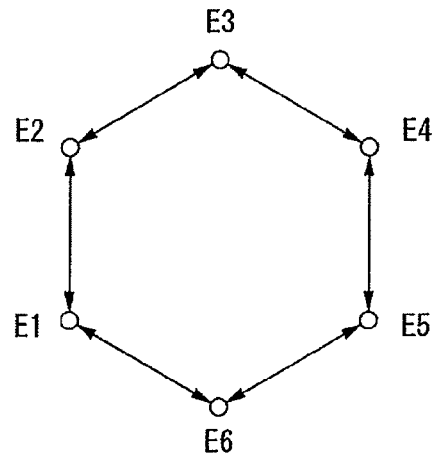
FIG. 8 is a diagram schematically illustrating carbon electrode positions in the apparatus for manufacturing a fused silica crucible according to the embodiment of the invention.
Figure 9:
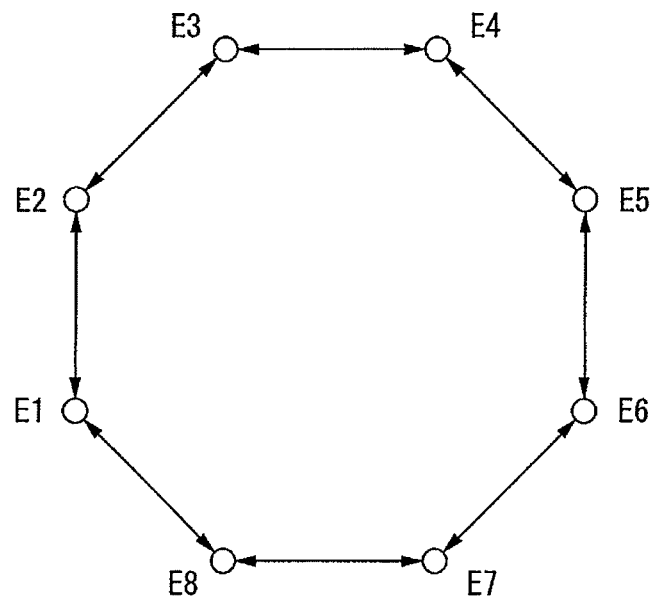
FIG. 9 is a diagram schematically illustrating carbon electrode positions in the apparatus for manufacturing a fused silica crucible according to the embodiment of the invention.
Figure 10:
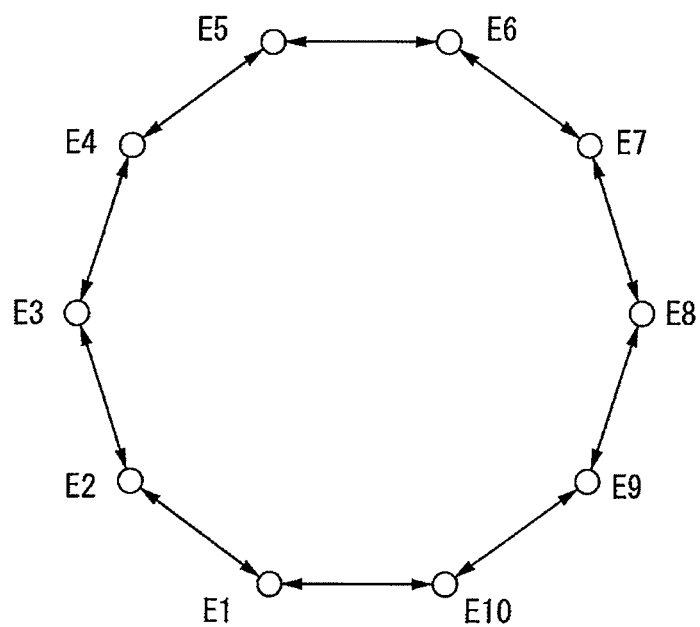
FIG. 10 is a diagram schematically illustrating carbon electrode positions in the apparatus for manufacturing a fused silica crucible according to the embodiment of the invention.
Figure 11:
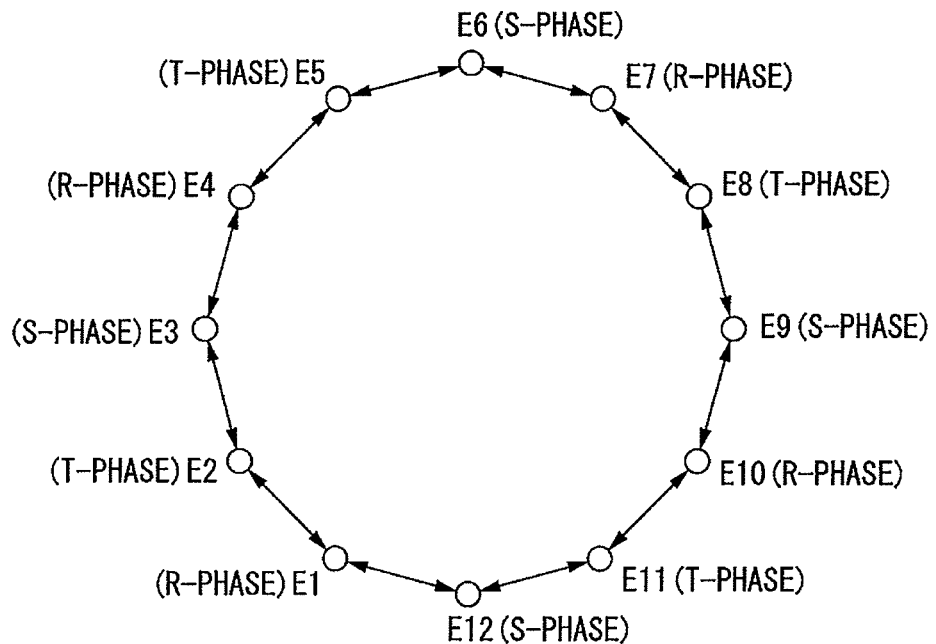
FIG. 11 is a diagram schematically illustrating carbon electrode positions in the apparatus for manufacturing a fused silica crucible according to the embodiment of the invention.
Figure 12:
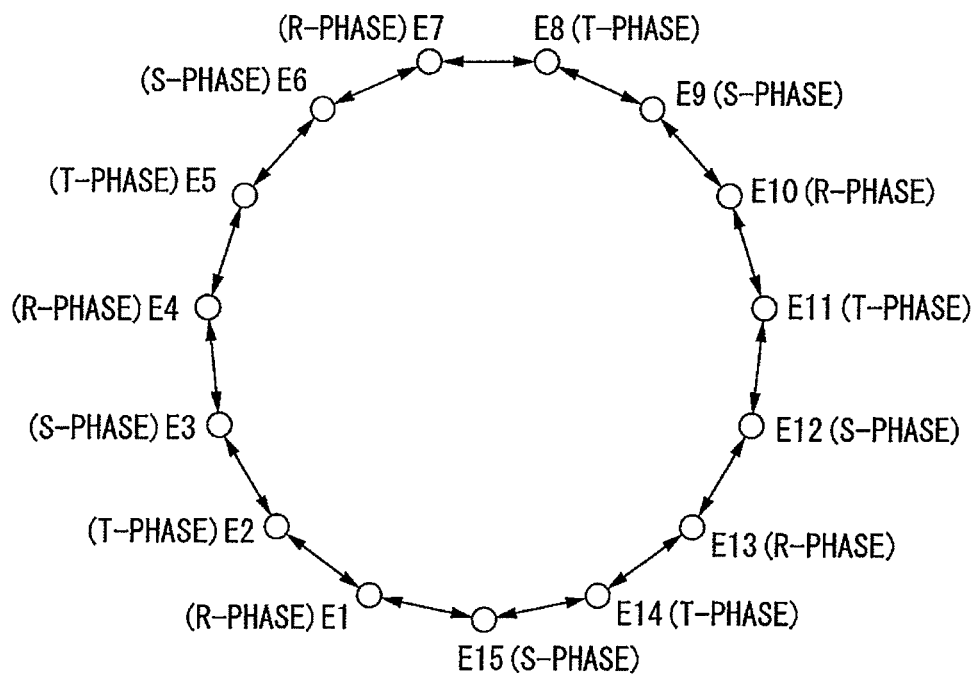
FIG. 12 is a diagram schematically illustrating carbon electrode positions in the apparatus for manufacturing a fused silica crucible according to the embodiment of the invention.
Figure 13:
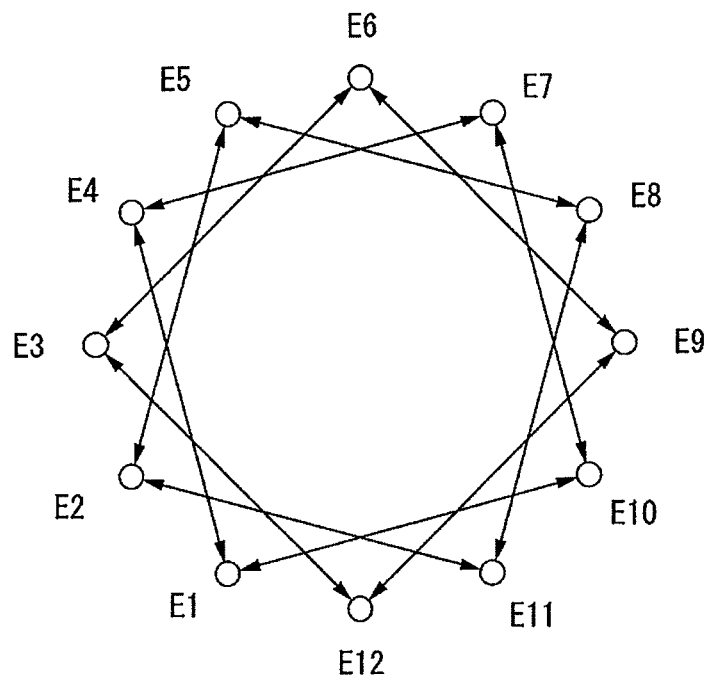
FIG. 13 is a diagram schematically illustrating carbon electrode positions in the apparatus for manufacturing a fused silica crucible according to the embodiment of the invention.
Figure 14:
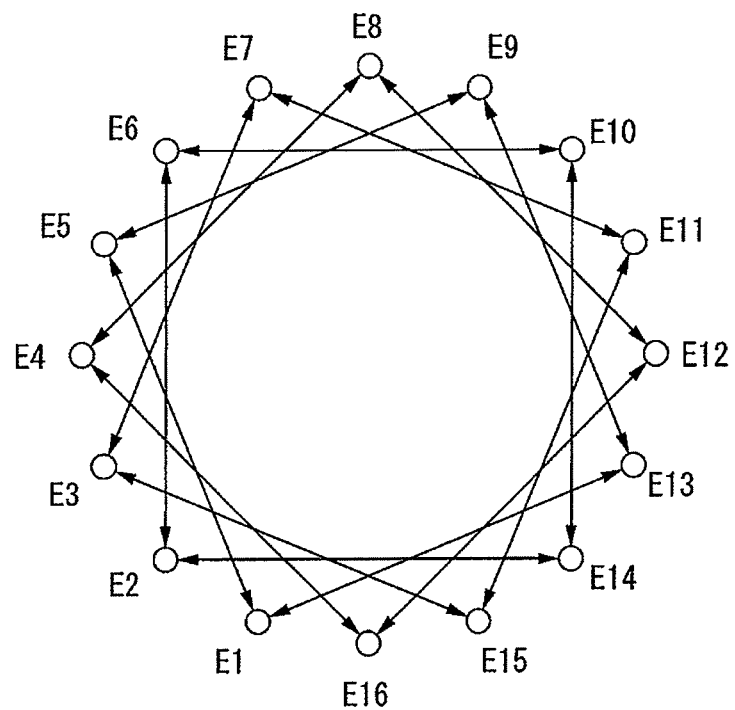
FIG. 14 is a diagram schematically illustrating carbon electrode positions in the apparatus for manufacturing a fused silica crucible according to the embodiment of the invention.
Figure 15:
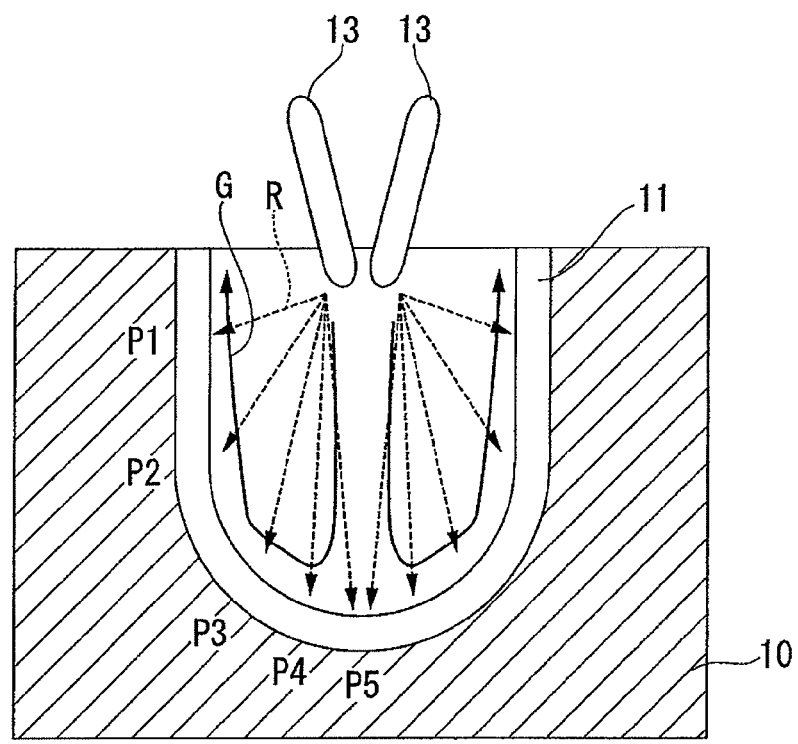
FIG. 15 is a diagram schematically illustrating a relationship between an electrode opening degree and a temperature in a manufacturing process of a fused silica crucible.
Figure 16:
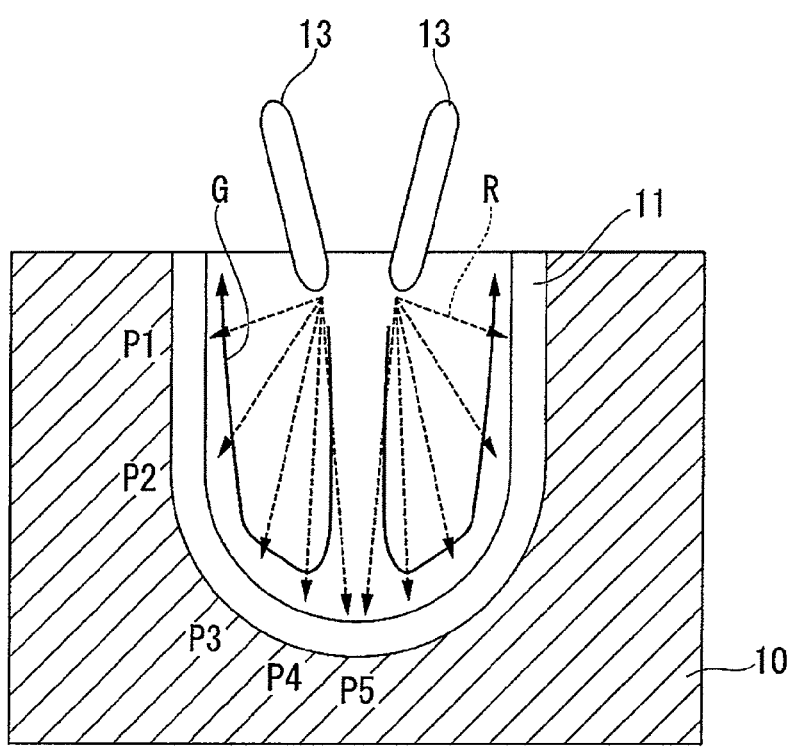
FIG. 16 is a diagram schematically illustrating a relationship between an electrode opening degree and a temperature in a manufacturing process of a fused silica crucible.

In addition, examples, such as, six two-phase AC electrodes in FIG. 8, eight two-phase AC electrodes in FIG. 9, ten two-phase AC electrodes in FIG. 10, twelve three-phase AC electrodes in FIG. 11, fifteen three-phase AC electrodes in FIG. 12, twelve four-phase AC electrodes in FIG. 13, and sixteen four-phase AC electrodes in FIG. 14, are shown.

Even in the electrode configurations, the values of W/R, H/R, H/H2, and D/R are set to be in the above-mentioned ranges, so that the distance from the vitreous silica powder compact 11 is maintained at an optimum state by preventing non-uniformity of the surface temperatures of the vitreous silica powder compact 11 at the rim 16 and the upper end 15 corresponding to the wall of the crucible, the portion 17 corresponding to the bottom of the crucible, and the center portion 18. In addition, the melted state is maintained to be in a preferable range by preventing differences between the melted states of the vitreous silica powder at those portions. Therefore, it is possible to manufacture a fused silica crucible having uniform inner surface properties, which is used for pulling large-diameter or large-size single crystals.

Particularly, in the manufacturing process of a large-diameter crucible of 32 inches or greater, it is possible to prevent excessive heating of a portion corresponding to the bottom of the crucible, and it is possible to prevent non-uniformity of properties of the inner surface in a direction from the center axis in the inner surface of the crucible, or in the height direction of the crucible.

In addition, it is preferable that a crucible of about 40 inches employ the electrode configuration of the fifteen three-phase AC electrodes or the sixteen four-phase AC electrodes.

In this embodiment, as the vitreous silica powder accumulated on the inner peripheral surface of the mold is heated and melted by the ring-shaped arc, a fused silica crucible having a transparent glass layer on the periphery of the crucible and an opaque layer on the outer periphery can be manufactured. When the transparent glass layer is formed on the inner periphery, the vitreous silica layer is subjected to pressure-reduction by the suction from the mold, and bubbles contained in the vitreous silica layer are sucked to the outside and removed, thereby obtaining a crucible with fewer bubbles therein.

In addition, during the rotational molding, the method of manufacturing (thermal spraying) a fused silica crucible involves supplying the vitreous silica powder through the range enclosed by the ring-shaped arc plasma so as to be heated and melted by the arc to become glass particles accumulated on the inner surface of the mold so as to form the transparent glass layer. The transparent glass layer may be formed on the bottom of the crucible or on the entire inner peripheral surface of the crucible.

In this embodiment, in the method of forming the ring-shaped arc, an arc is formed mainly between the neighboring electrodes, so that the arc becomes stable, and less air convection occurs in the crucible. Therefore, in the case where the vitreous silica powder is supplied through the range enclosed by the ring-shaped arc, the vitreous silica powder does not fly outside by the convection, and substantially all of the vitreous silica powder is supplied into the mold. Therefore, hardly any vitreous silica powder flies outside of the mold or adheres to the electrode. Accordingly, a suitable transparent glass layer can be formed on the bottom of the crucible or the entire surface of the crucible. On the other hand, as in the cases of the existing three three-phase AC electrodes and the six six-phase AC electrodes, when an arc is formed between the electrodes opposed to each other, significant air convection occurs in the vicinity of the center portion enclosed by the electrodes, and when the vitreous silica powder is supplied through this portion, the powder flies outside the crucible, adheres to the electrodes, or is inclined to fall off in high proportions. Therefore, it is difficult to form a uniform transparent glass layer on the inner periphery of the crucible.

When the manufacturing method and the apparatus in this embodiment employ the configuration with the larger number of electrodes as described above, for example, the configuration of six three-phase electrodes, particularly in the case where arc heating is performed from above the mold, that is, in the case of H>H2, the effect is more significant. During the arc melting, due to the exhaust gas of the furnace, the convection in the crucible, and the like, a large air flow occurs around the crucible. In the case where arc heating is performed from above the mold, the air flow has a significant effect thereon, and as described in Examples, when the inter-electrode distance between the three electrodes is increased, the arc is immediately broken. On the contrary, by the six three-phase electrodes of this embodiment, a stable arc can be obtained even in the case where the arc heating is performed from above the mold.

According to the manufacturing method and the manufacturing apparatus of this embodiment, melted glass is accumulated on the bottom of the crucible and a suitable transparent glass layer can be formed. Specifically, for example, a transparent glass layer having a bubble content of equal to or less than 0.03%, and preferably, equal to or less than 0.01% can be obtained. In addition, even in the case of a large crucible of 32 to 44 to 50 inches, suitable heating and melting are performed on the bottom, the corner, and the wall of the crucible, so that the transparent layer having small bubble contents at the corner or the wall can be obtained.

EXAMPLES

Hereinafter, Examples of the invention will be described.

Example 1

Fused silica crucibles having a diameter of 32 inches were manufactured by accumulating a vitreous silica powder to form an inner peripheral layer from an outer peripheral layer of the crucible in a rotational mold in advance according to rotational molding, employing the electrode configurations of the six three-phase AC electrodes of the invention, the existing three three-phase AC electrodes (Comparative Example 1), and the six six-phase AC electrodes (Comparative Example 2), changing the inter-electrode distances, and heating and melting the vitreous silica powder. The results thereof are shown in Table 1. In the electrode configuration of Comparative Example 1, extension of the electrodes had occurred, that is, frequent arc breakage had occurred in the case of the diameter of 81 mm of the circumference formed by the electrodes, and when the extension of the electrodes was further increased, an arc was not generated. In addition, in the electrode configuration of Comparative Example 2, a suitable arc was generated until the extension of the electrodes reached 122 mm. However, the distance was increased up to 405 mm, the arc became unstable, and when the distance was further increased, arc breakage frequently occurred. When arc breakage occurred between some of the electrodes, the arc became unstable, and this has an adverse effect on the heating and the melting of the vitreous silica powder.

TABLE 1

| Diameter of circumference (mm) | Example (six three-phase electrodes) | Comparative Example 1 (three three-phase electrodes) | Comparative Example 2 (six six-phase electrodes) |
|---|---|---|---|
| 81 (10%) | Arc stable, good | Frequent arc breakage | Arc good |
| 122 (15%) | Arc stable, good | Arc is not generated | Arc good |
| 162 (20%) | Arc stable, good | Arc is not generated | Arc slightly unstable |
| 203 (25%) | Arc stable, good | Arc is not generated | Arc unstable |
| 243 (30%) | Arc stable, good | Arc is not generated | Arc unstable |
| 405 (50%) | Arc stable, good | Arc is not generated | Arc unstable |
| 567 (70%) | Arc stable, good | Arc is not generated | Frequent arc breakage |
| 810 (100%) | Arc stable, good | Arc is not generated | Frequent arc breakage |

(Note)
the diameter of a circumference is the diameter of a circumference formed by the arranged electrodes, and % is a ratio thereof to the diameter of the opening of the crucible.

Example 2

In the manufacturing process of a fused silica crucible based on the rotational molding, for fused silica crucibles having a diameter of 32 inches, the electrode configurations (the diameter of the circumference formed by the arranged electrodes is 243 mm) of the six three-phase AC electrodes (Example) of the invention and the existing six six-phase AC electrodes (Comparative Example 2) were used to generate an arc five times by supplying a power of 1,000 kW for 20 minutes. Then, the stability of the arc was inspected. The results are shown in Table 2. In the electrode configuration of this embodiment, the arc was stable, so that the amount of power used was almost constant at any time. However, in Comparative Example 2, the arc was unstable, and the amount of power used at each time fluctuated significantly.

TABLE 2

| Arc times | First | Second | Third | Fourth | Fifth |
|---|---|---|---|---|---|
| Example (kWh) | 337 | 335 | 338 | 338 | 338 |
| Comparative Example 2 (kWh) | 284 | 317 | 266 | 291 | 322 |

Example 3

In the manufacturing process of a fused silica crucible based on the rotational molding, for crucibles having diameters of 22 to 40 inches, the electrode configurations of the six three-phase AC electrodes of the invention, the existing three three-phase AC electrodes (Comparative Example 1), and the existing six six-phase AC electrodes (Comparative Example 2) were used, and the inter-electrode distance was changed, in order to generate an arc by supplying power of 1,000 kW. Then, the stability of the arc was inspected. The results are shown in Table 3.

TABLE 3

| Diameter of crucible | Diameter of circumference | Example (six three-phase electrodes) | Comparative Example 1 (three three-phase electrodes) | Comparative Example 2 (six six-phase electrodes) |
|---|---|---|---|---|
| 22 inches | 140 mm | Arc stable, good | Arc is not generated | Arc good |
| 24 inches | 152 mm | Arc stable, good | Arc is not generated | Arc good |
| 26 inches | 166 mm | Arc stable, good | Arc is not generated | Arc slightly unstable |
| 28 inches | 178 mm | Arc stable, good | Arc is not generated | Arc slightly unstable |
| 30 inches | 190 mm | Arc stable, good | Arc is not generated | Arc unstable |
| 32 inches | 203 mm | Arc stable, good | Arc is not generated | Arc unstable |
| 36 inches | 223 mm | Arc stable, good | Arc is not generated | Arc unstable |
| 40 inches | 255 mm | Arc stable, good | Arc is not generated | Arc unstable |

(Note)
the diameter of circumference is the diameter of a circumference formed by the arranged electrodes, and each ¼ of the diameter of the opening of the crucible.

Example 4

In the manufacturing process of a fused silica crucible based on the rotational molding, the electrode configuration of the six three-phase AC electrodes of the invention was used, and the inter-electrode distance was changed, in order to manufacture a crucible of 32 inches. The bubble content and the single-crystal yield when a single-crystal silicon was pulled were inspected. The results are shown in Table. 4. In the cases (samples Nos. B1 and B2) where the diameter of the circumference formed by the arranged electrodes was much smaller than the diameter of the crucible, the heating of the wall of the crucible was insufficient, so that the bubble content in this portion was high. In addition, in the case (sample No. B3) where the circumference was greater than the diameter of the crucible, the heat of the arc was transferred to the outside of the crucible, and heating of the wall and the bottom of the crucible was deteriorated, so that the bubble content in these portions was high. Therefore, the single-crystal yield of any one of the samples Nos. B1 to B3 was low. On the contrary, with regard to the samples Nos. A1 to A3 of the embodiment, the bubble content of the wall and the bottom of the crucible was low, and the single-crystal yield was high.

TABLE 4

|  | Example | | | Comparative Sample | | |
|---|---|---|---|---|---|---|
|  | A1 | A2 | A3 | B1 | B2 | B3 |
| Diameter of arranged electrodes (mm) | 600 | 400 | 200 | 100 | 150 | 850 |
| Circumference ratio (%) | 74 | 49 | 25 | 12 | 19 | 105 |
| Bubble       Wall | 0.01 | 0.02 | 0.05 | 0.3 | 0.21 | 0.19 |
| Content     Bottom | 0.02 | 0.02 | 0.03 | 0.02 | 0.03 | 0.33 |
| Single-crystal yield (%) | 80 | 80 | 73 | 25 | 38 | 5 |
| Evaluation | ○ | ○ | Δ | X | X | X |

(Note)
the circumference ratio is a ratio of the diameter of the circumference formed by the arranged electrodes to the diameter of the crucible.
Evaluation: ○ is good, Δ is suitable, and X is poor.

Example 5

In the manufacturing process of a fused silica crucible based on the rotational molding, the electrode configurations of the six three-phase AC electrodes of the invention and the existing three three-phase AC electrodes were used, a vitreous silica powder for forming an outer peripheral layer and a center layer was accumulated on an inner peripheral surface of the mold, arc melting was performed thereon, and a vitreous silica powder of 4 kg was supplied through the inside of the circumference formed by the arranged electrodes for 20 minutes such that the thickness of the transparent layer became 1 mm, thereby manufacturing a crucible of 32 inches using thermal spraying. The thickness of the transparent layer of the crucible, the bubble content, and the single-crystal yield were inspected. The results are shown in Table 5. In comparative samples Nos. B11 to B13, since the diameter of the circumference formed by the arranged electrodes was small, when the vitreous silica powder was supplied between the electrodes as a raw material, the vitreous silica powder adhered to the electrodes. Therefore, it was difficult to form the transparent layer having the thickness of 1 mm, and particularly, the layer thickness of the wall was significantly small. In addition, in the comparative samples Nos. B11 to B13, a solidified mass of the vitreous silica was exfoliated from the electrodes and fell into the crucible, and unevenness was generated on the inner peripheral surface of the crucible. In addition, in the comparative samples Nos. B11 to B13, the bubble content was high, so that the single-crystal yield was also small. On the contrary, in samples Nos. A11 to A13 of this embodiment, the bubble contents at the wall and the bottom of the crucible were low, and the single-crystal yields were high.

TABLE 5

|  | Example | | | Comparative sample | | |
|---|---|---|---|---|---|---|
|  | A11 | A12 | A13 | B11 | B12 | B13 |
| Electrode configuration | Six three-phase electrodes | Six three-phase electrodes | Six three-phase electrodes | Three three-phase electrodes | Three three-phase electrodes | Three three-phase electrodes |
| Diameter of arranged electrodes (mm) | 600 | 400 | 200 | 100 | 150 | 50 |
| Circumference ratio (%) | 74 | 49 | 25 | 12 | 19 | 6 |
| Transparent layer     Wall | 1 mm | 1 mm | 1 mm | 0.1 mm | 0.3 mm | 0.1 mm |
| thickness                    Bottom | 1 mm | 1 mm | 1 mm | 0.8 mm | 1 mm | 0.8 mm |
| Bubble content     Wall | 0.02 | 0.02 | 0.08 | 0.12 | 0.07 | 0.12 |
| (%)                              Bottom | 0.02 | 0.02 | 0.02 | 0.02 | 0.02 | 0.02 |
| Single-crystal yield (%) | 80 | 80 | 75 | 35 | 41 | 10 |
| Evaluation | ○ | ○ | Δ | X | X | X |

(Note)
the circumference ratio is a ratio of the diameter of the circumference formed by the arranged electrodes to the diameter of the crucible.
Evaluation: ○ is good, Δ is suitable, and X is poor.

Example 6

Likewise, when a fused silica crucible of 32 inches was manufactured, the differences of the values of W/R, H/R, H/H2, and D/R depending on the electrode configurations were examined, and the single-crystal yield was measured when a single-crystal silicon of φ300 mm was pulled by using the manufactured fused silica crucible.

W/R was changed in Examples 1 to 6, H/R was changed in Examples 7 to 12, H/H2 was changed in Examples 13 to 18, and D/R was changed in Examples 19 to 24. In each example, the arc state, the bubble contents of the wall (side wall) and the bottom of the crucible, the standard deviation of a power amount, the single crystallization ratio of the pulled single-crystal silicon, and the evaluation of the fused silica crucible based on the single crystallization ratio or the like are shown in Tables 6 to 9.

Here, type 1 device a type of the electrode configuration, and device four two-phase electrodes, six two-phase electrodes, eight two-phase electrodes, ten two-phase electrodes, three three-phase electrodes, six three-phase electrodes, nine three-phase electrodes, twelve three-phase electrodes, fifteen three-phase electrodes, four four-phase electrodes, eight four-phase electrodes, twelve four-phase electrodes, or sixteen four-phase electrodes. In addition, other than type 1 device other electrode configurations than the above-mentioned electrode configurations.

In addition, the single-crystal yield of the pulling of a single-crystal silicon is a ratio of a length of the single-crystal from which silicon wafers can be sliced, to the entire length of the crystal axis of a cylinder portion of the pulled silicon crystal. The single crystallization ratio is a ratio of the weight of the cylinder portion from which single-crystal silicon wafers without crystal dislocation can be obtained, to the total weight of polysilicon injected into the crucible. When the single crystallization ratio is changed by 1%, the changed number of wafers that can be obtained is about 20.

TABLE 6

| | W/R | Electrode configuration | Arc state | Bubble content (%) Wall | Bubble content (%) Bottom | Standard deviation of amount of power (kWH) | Single crystallization ratio (%) | Evaluation |
|---|---|---|---|---|---|---|---|---|
| Experimental Example 1 | 0.5 | Type 1 | Stable | 0.025 | 0.021 | 10 | 88 | ○ |
| Experimental Example 2 | 0.8 | Type 1 | Stable | 0.021 | 0.023 | 13 | 87 | ○ |
| Experimental Example 3 | 0.001 | Type 1 | Unstable | 0.041 | 0.037 | 43 | 45 | X |
| Experimental Example 4 | 0.99 | Type 1 | Unstable | 0.038 | 0.051 | 32 | 32 | X |
| Experimental Example 5 | 0.5 | Other than Type 1 | Unstable | 0.065 | 0.062 | 45 | 35 | X |
| Experimental Example 6 | 0.8 | Other than Type 1 | Unstable | 0.058 | 0.06 | 38 | 44 | X |

Data of n = 10

TABLE 7

| | H/R | Electrode configuration | Arc state | Bubble content (%) Wall | Bubble content (%) Bottom | Standard deviation of amount of power (kWH) | Single crystallization ratio (%) | Evaluation |
|---|---|---|---|---|---|---|---|---|
| Experimental Example 7 | 0.1 | Type 1 | Stable | 0.023 | 0.02 | 11 | 87 | ○ |
| Experimental Example 8 | 9.0 | Type 1 | Stable | 0.019 | 0.021 | 8 | 87 | ○ |
| Experimental Example 9 | 0.01 | Type 1 | Unstable | 0.044 | 0.047 | 41 | 43 | X |
| Experimental Example 10 | 9.5 | Type 1 | Unstable | 0.047 | 0.048 | 35 | 31 | X |
| Experimental Example 11 | 0.1 | Other than Type 1 | Unstable | 0.068 | 0.063 | 46 | 36 | X |
| Experimental Example 12 | 9.0 | Other than Type 1 | Unstable | 0.061 | 0.063 | 34 | 46 | X |

Data of n = 10

TABLE 8

| | H/H2 | Electrode configuration | Arc state | Bubble content (%) Wall | Bubble content (%) Bottom | Standard deviation of amount of power (kWH) | Single crystallization ratio (%) | Evaluation |
|---|---|---|---|---|---|---|---|---|
| Experimental Example 13 | 0.01 | Type 1 | Stable | 0.021 | 0.021 | 9 | 84 | ○ |
| Experimental Example 14 | 3.5 | Type 1 | Stable | 0.02 | 0.021 | 12 | 83 | ○ |
| Experimental Example 15 | 0.0005 | Type 1 | Unstable | 0.054 | 0.042 | 46 | 42 | X |
| Experimental Example 16 | 4.2 | Type 1 | Unstable | 0.039 | 0.055 | 38 | 31 | X |
| Experimental Example 17 | 0.01 | Other than Type 1 | Unstable | 0.066 | 0.063 | 42 | 31 | X |
| Experimental Example 18 | 3.5 | Other than Type 1 | Unstable | 0.061 | 0.057 | 40 | 42 | X |

Data of n = 10

TABLE 9

|  | D/R | Electrode configuration | Arc state | Bubble content (%) Wall | Bubble content (%) Bottom | Standard deviation of amount of power (kWH) | Single crystallization ratio (%) | Evaluation |
|---|---|---|---|---|---|---|---|---|
| Experimental Example 19 | 0.05 | Type 1 | Stable | 0.017 | 0.018 | 6 | 84 | ◯ |
| Experimental Example 20 | 1.0 | Type 1 | Stable | 0.02 | 0.02 | 7 | 88 | ◯ |
| Experimental Example 21 | 0.02 | Type 1 | Unstable | 0.055 | 0.048 | 36 | 46 | X |
| Experimental Example 22 | 1.3 | Type 1 | Unstable | 0.051 | 0.056 | 38 | 36 | X |
| Experimental Example 23 | 0.05 | Other than Type 1 | Unstable | 0.067 | 0.066 | 41 | 36 | X |
| Experimental Example 24 | 1.0 | Other than Type 1 | Unstable | 0.06 | 0.07 | 39 | 45 | X |

Data of n = 10

From the results, it can be seen that by setting the values of W/R, H/R, H/H2, and D/R according to the invention to be in the above-mentioned ranges, a fused silica crucible having a high evaluation level at a high wafer yield can be manufactured.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing a fused silica crucible by heating and melting a vitreous silica powder compact shaped into a mold using arc discharge of electrodes arranged around a rotation shaft of the mold, comprising the steps of:
    arranging the electrodes in a ring shape;
    heating and melting the vitreous silica powder by not generating a sustainable arc between the electrodes opposed to each other through a center portion of the ring but forming a stable ring-shaped arc that connects the neighboring electrodes; and
    setting a ratio W/R of a horizontal distance W between the electrode front end and the surface of the vitreous silica powder compact to a vitreous silica powder compact opening radius R, for at least a predetermined time during arc heating, to be in the range of 0.002 to 0.98, wherein the bubble content of a transparent layer of the bottom and a transparent layer of the wall of the manufactured crucible is equal to or less than 0.03%.

2. The method according to claim 1, wherein a ratio H/R of a vertical distance H between the electrode front end and the surface of the vitreous silica powder compact to the vitreous silica powder compact opening radius R, for at least a predetermined time during arc heating, is set to be in the range of 0.02 to 9.2.

3. The method according to claim 1, wherein a ratio H/H2 of the vertical distance H between the electrode front end and the surface of the vitreous silica powder compact to the vitreous silica powder compact height H2, for at least a predetermined time during arc heating, is set to be in the range of 0.0007 to 4.

4. The method according to claim 1, wherein a ratio D/R of the horizontal distance D between the neighboring electrodes to the vitreous silica powder compact opening radius R, for at least a predetermined time during arc heating, is set to be in the range of 0.04 to 1.1.

5. The method according to claim 1, wherein the ring-shaped arc is formed by using an electrode configuration in which the electrodes are arranged in a ring-shape at even intervals such that the absolute value of an alternating current phase difference θ between the neighboring electrodes is in the range of $90° \leq \theta \leq 180°$.

6. The method according to claim 1, wherein the ring-shaped arc is formed by using an electrode configuration in which a ratio of a radius r of a circumference around the mold rotation shaft of the ring to the vitreous silica powder compact opening radius R is in the range of 1 to ¼, for at least a predetermined time during arc heating.

7. An apparatus for manufacturing a fused silica crucible by rotational molding, comprising:
    electrodes arranged in a ring shape around a rotation shaft of a mold; and
    an electrode position setting device capable of setting:
        a ratio W/R of a horizontal distance W between the electrode front end and the surface of the vitreous silica powder compact charged into the mold to a vitreous silica powder compact opening radius R to be in the range of 0.002 to 0.98,
        a ratio H/R of a vertical distance H between the electrode front end and the surface of the vitreous silica powder compact to the vitreous silica powder compact opening radius R to be in the range of 0.02 to 9.2,
        a ratio H/H2 of the vertical distance H between the electrode front end and the surface of the vitreous silica powder compact to the vitreous silica powder compact height H2 to be in the range of 0.0007 to 4, and
        a ratio D/R of the horizontal distance D between the neighboring electrodes to the vitreous silica powder compact opening radius R to be in the range of 0.04 to 1.1,
    wherein:
        a sustainable arc is not generated between the electrodes opposed to each other through a center portion of the ring, but a stable ring-shaped arc that connects the neighboring electrodes is formed, and
        the bubble content of a transparent layer of the bottom and a transparent layer of the wall of the manufactured crucible is equal to or less than 0.03%.

8. The apparatus according to claim 7, wherein the apparatus includes an electrode configuration in which the electrodes are arranged in a ring-shape such that the absolute value of an alternating current phase difference θ between the neighboring electrodes is in the range of $90° \leq \theta \leq 180°$.

9. The apparatus according to claim 7, wherein the electrode position setting device sets a ratio of a radius r of a circumference around the mold rotation shaft of the ring to the vitreous silica powder compact opening radius R to be in the range of 1 to ¼.

10. The apparatus according to claim 7, wherein one electrode configuration of four two-phase AC electrodes, six two-phase AC electrodes, eight two-phase AC electrodes, ten two-phase AC electrodes, three three-phase AC electrodes, six three-phase AC electrodes, nine three-phase AC electrodes, twelve three-phase AC electrodes, fifteen three-phase AC electrodes, four four-phase AC electrodes, eight four-phase AC electrodes, twelve four-phase AC electrodes, and sixteen four-phase AC electrodes, is included.

\* \* \* \* \*